(12) United States Patent
Lin et al.

(10) Patent No.: US 7,218,563 B1
(45) Date of Patent: May 15, 2007

(54) METHOD AND APPARATUS FOR READING DATA FROM NONVOLATILE MEMORY

(75) Inventors: Yung Feng Lin, Taoyuan (TW); Yu Shen Lin, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 11/282,541

(22) Filed: Nov. 18, 2005

(51) Int. Cl.
G11C 7/00 (2006.01)
(52) U.S. Cl. ............ 365/203; 365/185.16; 365/185.25; 365/185.26
(58) Field of Classification Search ................ 365/203, 365/185.16, 185.25, 185.26
See application file for complete search history.

(56) References Cited

U.S. PATENT DOCUMENTS

| | | | |
|---|---|---|---|
| 6,510,082 B1 | 1/2003 | Le et al. | |
| 6,522,585 B2 * | 2/2003 | Pasternak | 365/185.21 |
| 6,525,969 B1 * | 2/2003 | Kurihara et al. | 365/185.25 |
| 6,529,412 B1 * | 3/2003 | Chen et al. | 365/185.21 |
| 6,731,542 B1 | 5/2004 | Le et al. | |
| 6,744,674 B1 | 6/2004 | Le et al. | |
| 6,771,543 B2 | 8/2004 | Wong et al. | |
| 2006/0109710 A1 * | 5/2006 | Hsieh et al. | 365/185.2 |

* cited by examiner

*Primary Examiner*—Anh Phung
*Assistant Examiner*—Toan Le
(74) *Attorney, Agent, or Firm*—Kenta Suzue; Haynes Beffel & Wolfeld LLP

(57) ABSTRACT

Various embodiments address the problem of efficiently reading data from nonvolatile memory. Nonvolatile memory circuit, method, and manufacturing method embodiments relate to a virtual ground array of nonvolatile memory cells which are read by precharging the drains of multiple nonvolatile memory cells and measuring the resulting currents. Power consumption and read margins are improved by reading multiple cells. Unnecessary bit line precharging can be avoided.

24 Claims, 5 Drawing Sheets

METHOD AND APPARATUS FOR READING DATA FROM NONVOLATILE MEMORY

BACKGROUND OF THE INVENTION

1. Field of the Invention

The present technology relates to a read operation performed in nonvolatile memory, and in particular relates to precharging particular bit lines of the nonvolatile memory.

2. Description of Related Art

FIG. 1 shows a prior art schematic of a circuit reading data stored on nonvolatile memory by precharging a bit line, and measuring the data with a sense amplifier and ground connected to other bit lines.

Nonvolatile memory cells M100, M101, M102, and M103 all have a gate connected to a common word line. The shown cells are part of a larger virtual ground array of nonvolatile memory cells. Circuitry 102 and 104 represent Y-pass and main bit line circuitry. The schematic of FIG. 1 shows in particular a read operation being performed on nonvolatile memory cell M100. To perform the read operation, circuitry 104 connects a bit line connected to the source of nonvolatile memory cell M100 to a ground voltage, and circuitry 102 connects a bit line connected to the drain of nonvolatile memory cell M100 to a sense amplifier 108. After the drain of nonvolatile memory cell M100 is sufficiently precharged, then the sense amplifier 108 measures the current I200 to determine the data value stored in nonvolatile memory cell M100.

In practice, the read operation in FIG. 1 has undesirable characteristics. There is no guarantee that the current measured by the sense amplifier 108 is equivalent to the current I200 flowing through the nonvolatile memory cell M100. If the voltages of other current carrying terminals of other nonvolatile memory cells is less than the precharge voltage of the drain of nonvolatile memory cell M100, then leakage current such as current I202 will result. For example, this leakage current can result from array data dependency, such as when a sensed memory cell has a neighboring memory cell with a very low threshold voltage. Such leakage current is undesirable, because the read margin of the sense amplifier is reduced. Accordingly, it would be desirable to reduce leakage current that occurs during a read operation.

One approach to decreasing leakage current is to precharge not just the bit line connected to the drain of the nonvolatile memory cell storing data to be read, but to precharge an additional bit line on the drain side of the nonvolatile memory cell storing values to be read. Precharging these additional bit lines results in a low voltage difference between these additional bit lines and the bit line connected to the drain of the nonvolatile memory cell storing data to be read. Due to the precharged additional bit line(s), leakage current is low, and the sense amplifier has a high read margin.

However, this approach to decreasing leakage current is still problematic. Power consumption is unnecessarily high, because bit lines are precharged other than the bit line connected to the drain of the nonvolatile memory cell storing data to be read. Also, the leakage current problem, rather than being eliminated, is simply moved, so that current is diverted not from the bit line connected to the drain of the nonvolatile memory cell storing data to be read, but from another bit line. This continued current leakage also represents a continuing issue with power consumption. Accordingly, it would be desirable to reduce power consumption during a read operation.

SUMMARY OF THE INVENTION

Various embodiments address the problem of efficiently reading data from nonvolatile memory. A nonvolatile memory circuit embodiment has a virtual ground array of memory cells, switching circuitry, and logic controlling the virtual ground array of memory cells and the switching circuitry. The virtual ground array of nonvolatile memory cells is arranged in a plurality of rows and a plurality of columns. Each of the nonvolatile memory cells includes a gate, a first current carrying terminal, and a second current carrying terminal. The switching circuitry couples the current carrying terminals of the nonvolatile memory cells to reference and precharge voltages and sense amplifiers. The logic responds to a read command, as follows. The logic couples one of the current carrying terminals of at least two nonvolatile memory cells of the virtual ground array to the reference voltage. The logic reduces leakage currents associated with the read command by coupling another of the current carrying terminals of the nonvolatile memory cells to the precharge voltage. Then, the logic measures currents flowing through the nonvolatile memory cells via sense amplifiers coupled to said another of the current carrying terminals of the nonvolatile memory cells.

For example, a first nonvolatile memory cell and a second nonvolatile memory cell of the virtual ground array each have a drain terminal and a source terminal. The source terminal of both the first and second nonvolatile memory cells is coupled to the reference voltage, typically ground. The drain terminal of both the first and second nonvolatile memory cells is coupled to the precharge voltage. Currents flowing through the first and second nonvolatile memory cells are measured via sense amplifiers coupled to the drains of the current carrying terminals of the nonvolatile memory cells.

Typically, the first and second nonvolatile memory cells of the virtual ground array are in a same row of the plurality of rows and in different columns of the plurality of columns of the virtual ground array. The first and second nonvolatile memory cells are typically separated by at least two columns of the plurality of columns of the virtual ground array. This separation increases the effective resistance between the drains of the first and second nonvolatile memory cells, thereby decreasing leakage current.

Typically, these measured currents include a first current flowing through the first nonvolatile memory cell and a second current flowing through the second nonvolatile memory cell, which flow in opposite directions through the same row.

Various embodiment also include a plurality of bit lines coupled to the switching circuitry and the virtual ground array. In response to the read command, only bit lines of the plurality of bit lines connected to said another of the current carrying terminals of the first and second nonvolatile memory cells are coupled to the precharge voltage.

Various embodiments also include the plurality of sense amplifiers coupled to the switching circuitry.

In various embodiments, the nonvolatile memory cells store data on charge trapping material or floating gate material or nanocrystal material.

Other embodiments of the technology are a method performing the read command, and a method of manufacturing the nonvolatile memory.

DETAILED DESCRIPTION

Figure 2:
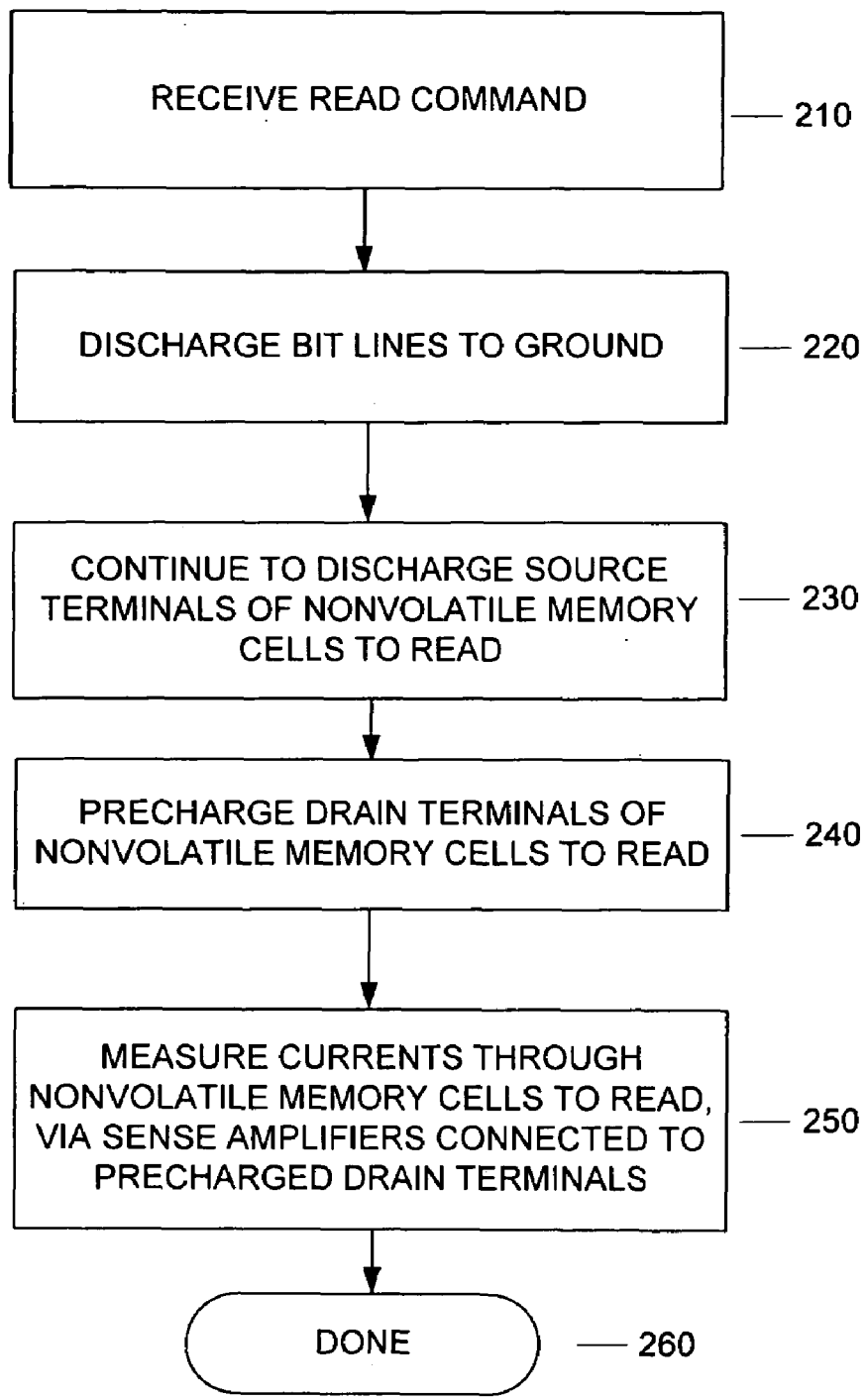
FIG. 2 shows an exemplary flow of reading data stored on nonvolatile memory by precharging bit lines, and measuring the data with a sense amplifier connected to the bit lines.

FIG. 2 shows an exemplary flow of reading data stored on nonvolatile memory by precharging bit lines, and measuring the data with a sense amplifier connected to the bit lines. In 210, a read command is received. The read command is typically for multiple nonvolatile memory cells. However, if the read command is for a single nonvolatile memory cell, then currents corresponding to the extra unneeded nonvolatile memory cells can be ignored. In 220, the bit lines are discharged to ground. This typically occurs in response to the address transition detected (ATD) phase. In 230, the source terminals of the nonvolatile memory cells to be read are continuously discharged to ground. In 240, the drain terminals of the nonvolatile memory cells to be read are precharged up to the target voltage value, such as 1.5–1.6 V. Instead of precharging neighboring bit lines for the sole purpose of decreasing leakage current, bit lines that are precharged correspond to bit lines connected to drain terminals of nonvolatile memory cells to be read. In 250, currents flowing through the nonvolatile memory cells are measured via sense amplifiers connected to the precharged drain terminals. This occurs when sufficient sensing margin exists at each sense amplifier.

Figure 3:
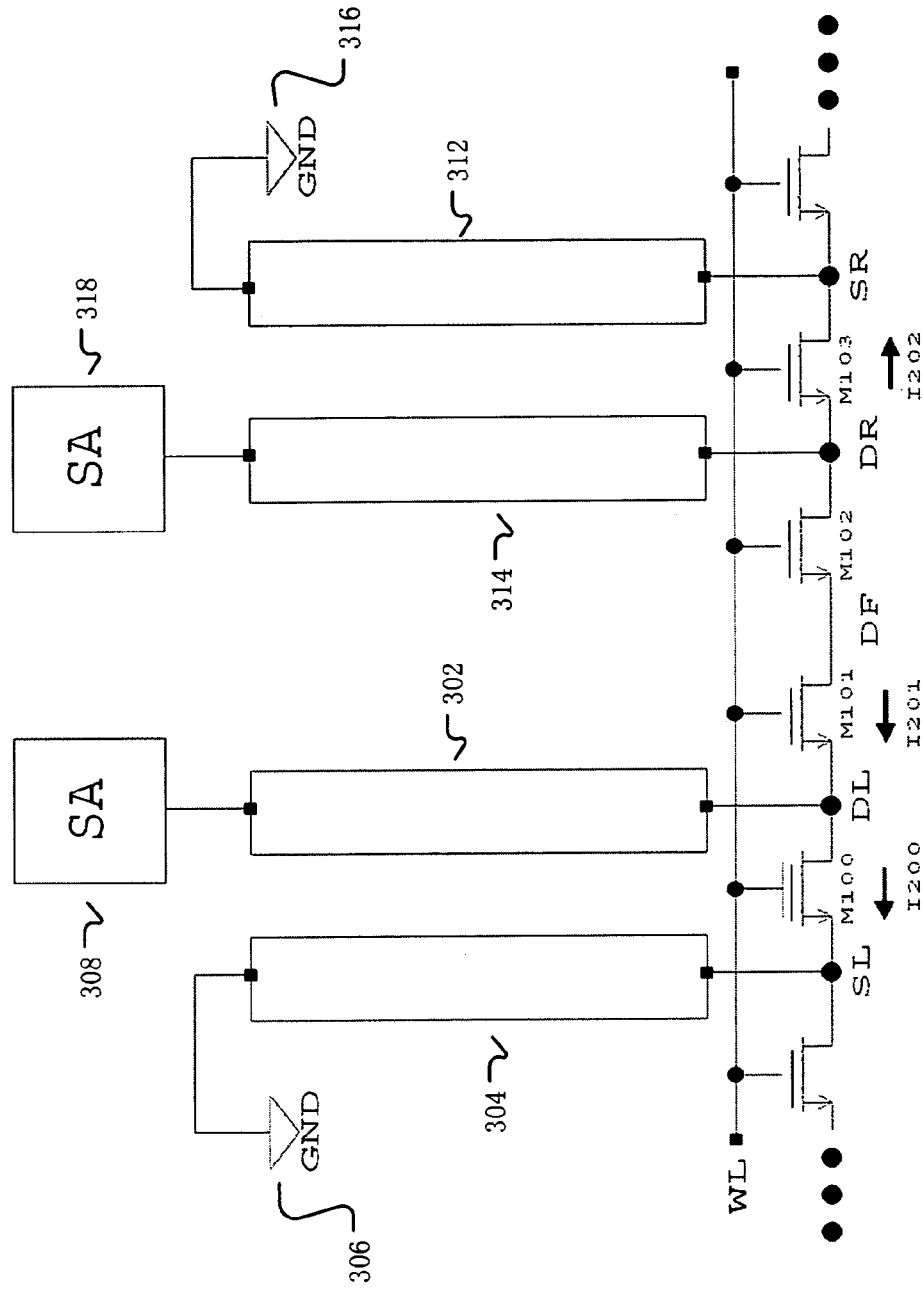
FIG. 3 shows an example schematic of a circuit precharging a bit line, and measuring the data with a sense amplifier connected to the bit lines and ground connected to other bit lines.

FIG. 3 shows an example schematic of a circuit precharging a bit line, and measuring the data with a sense amplifier to the bit lines and ground connected to other bit lines.

Nonvolatile memory cells M100, M101, M102, and M103 are in the same row and all have a gate connected to a common word line. The shown cells are part of a larger virtual ground array of nonvolatile memory cells. Circuitry 302, 304, 312, and 314 represent Y-pass and main bit line circuitry. The schematic of FIG. 3 shows in particular a read operation being performed on nonvolatile memory cells M100 and M103. To perform the read operation, circuitry 304 connects a bit line connected to the source of nonvolatile memory cell M100 to a ground voltage, circuitry 302 connects a bit line connected to the drain of nonvolatile memory cell M100 to a sense amplifier 308, circuitry 312 connects a bit line connected to the source of nonvolatile memory cell M103 to a ground voltage, circuitry 314 connects a bit line connected to the drain of nonvolatile memory cell M103 to a sense amplifier 318. Precharge circuitry is not shown explicitly in FIG. 3, and can be either part of the sense amplifier or separate from the sense amplifier. After the drains of nonvolatile memory cells M100 and M103 are sufficiently precharged, then the sense amplifier 308 measures the current I200 to determine the data value stored in nonvolatile memory cell M100, and the sense amplifier 318 measures the current I202 to determine the data value stored in nonvolatile memory cell M103. Currents I200 and I202 flow in opposite directions.

The current measured by the sense amplifier 308 may not be exactly equivalent to the current I200 flowing through the nonvolatile memory cell M100, and the current measured by the sense amplifier 318 may not be exactly equivalent to the current I202 flowing through the nonvolatile memory cell M103. However, because the precharged voltage of nodes DL and DR, respectively the drain terminal of nonvolatile memory cell M100 and the drain terminal of nonvolatile memory cell M103, are relatively close to each other in value, leakage current such as current I201 is relatively small. Thus, measuring the current I200 flowing through the nonvolatile memory cell M100 can be reasonably performed by measuring the current flowing through the sense amplifier 308, and measuring the current I202 flowing through the nonvolatile memory cell M103 can be reasonably performed by measuring the current flowing through the sense amplifier 318. By decreasing undesirable leakage current in this manner, the read margin of the sense amplifier is largely maintained. Nonvolatile memory cells M100 and M103 are separated by two columns of cells, represented by nonvolatile memory cells M101 and M102. The two nonvolatile memory cells M101 and M102 effectively represent a doubled series resistance between the drain terminals of nonvolatile memory cells M100 and M103, further reducing leakage current. The number of intervening columns of cells between the nonvolatile memory cells to be read can be varied to one column (at the cost of increased leakage current) or to three or more columns. Accordingly, the circuit reduces leakage current that occurs during a read operation.

One approach to decreasing leakage current is to precharge not just the bit line connected to the drain of the nonvolatile memory cell storing data to be read, but to precharge an additional bit line on the drain side of the nonvolatile memory cell storing values to be read. Precharging these additional bit lines results in a low voltage difference between these additional bit lines and the bit line connected to the drain of the nonvolatile memory cell storing data to be read. Due to the precharged additional bit line(s), leakage current is low, and the sense amplifier has a high read margin.

Figure 1:
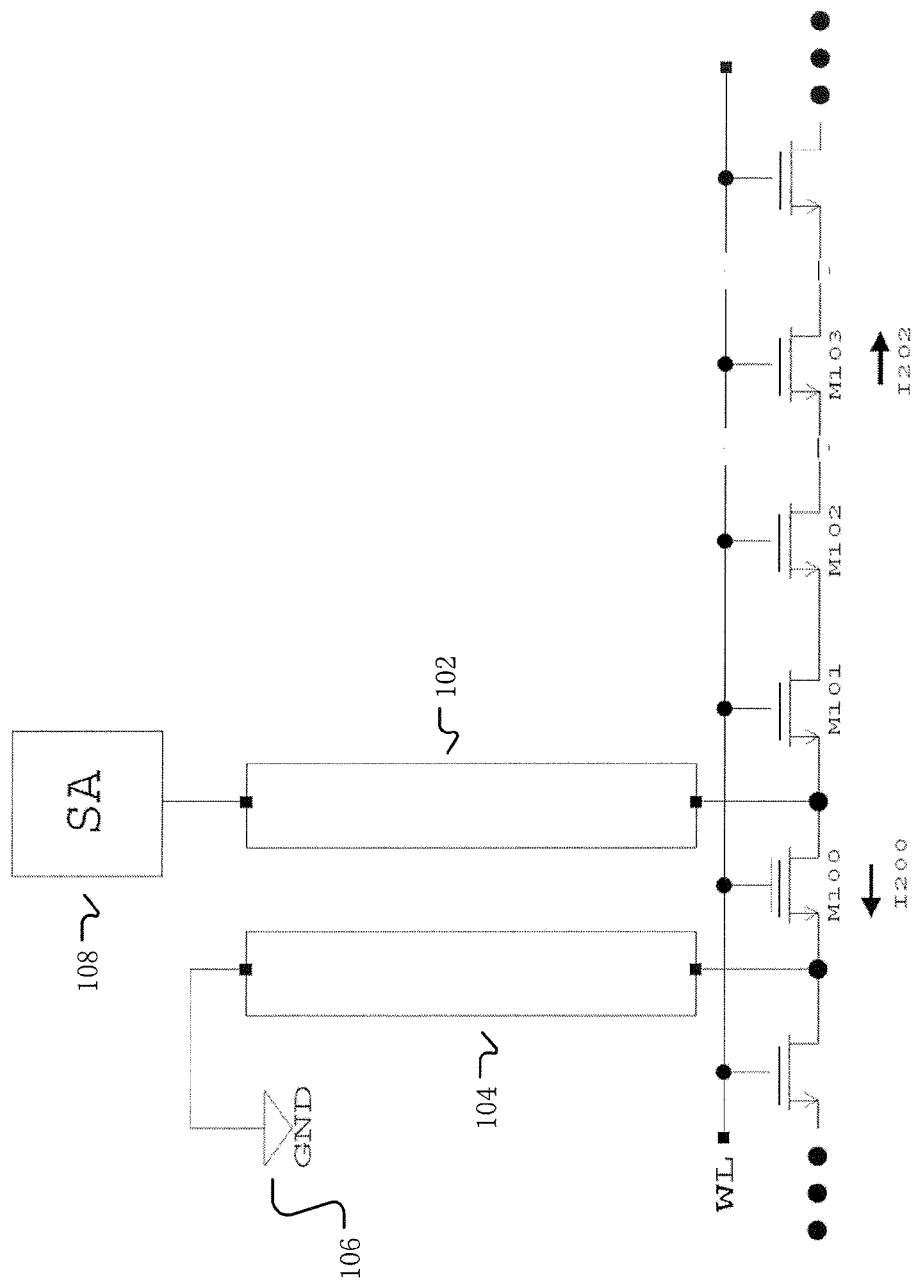
FIG. 1 shows a prior art schematic of a circuit reading data stored on nonvolatile memory by precharging a bit line, and measuring the data with a sense amplifier and ground connected to other bit lines.

This approach to decreasing leakage current also address the issue of unnecessary power consumption. Power consumption is not unnecessarily high, because the bit lines that are precharged are the very same bit lines that are connected to the drains of the nonvolatile memory cells storing data to be read. Also, unlike the circuit of FIG. 1, where the leakage current problem rather than being eliminated is simply moved such that current is diverted not from the bit line connected to the drain of the nonvolatile memory cell storing data to be read but from another bit line, the leakage current is substantially decreased because the leakage current problem is reduced to the leakage current flowing between the drains of the nonvolatile memory cells storing data to be read, which share substantially similar voltages due to being precharged to the same precharge voltage. Accordingly, the circuit of FIG. 3 reduces power consumption during a read operation.

Figure 4:
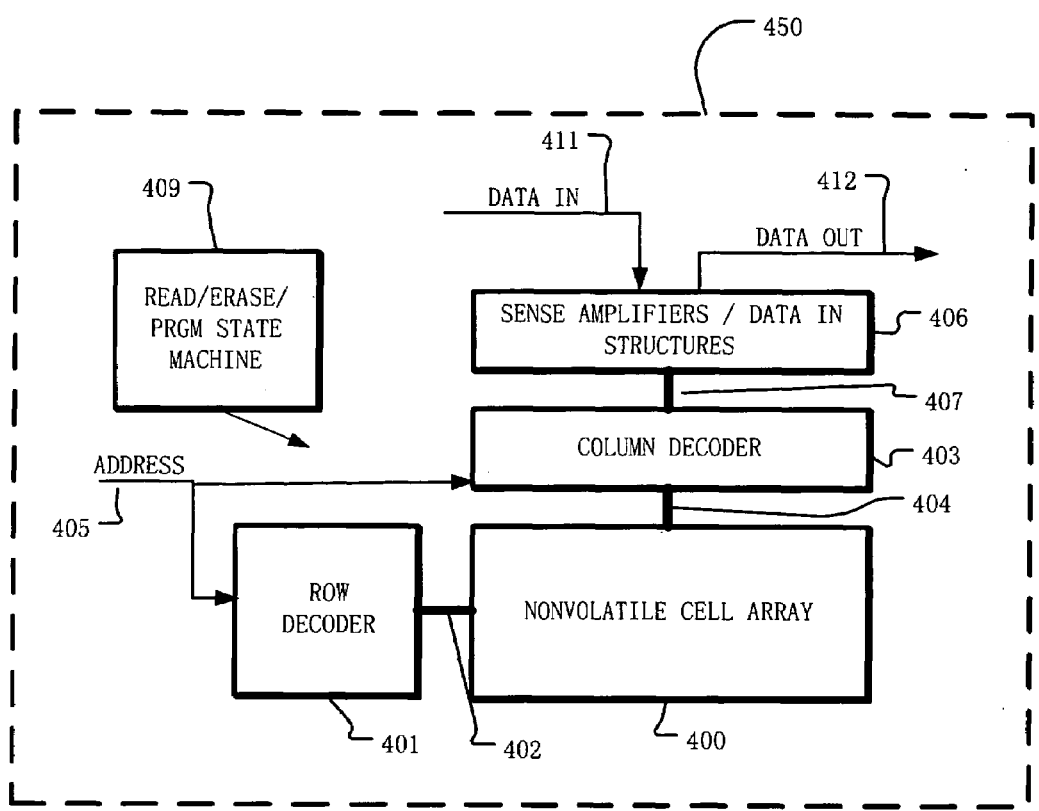
FIG. 4 shows an example schematic of a nonvolatile memory integrated circuit embodiment.

FIG. 4 shows an example schematic of a nonvolatile memory integrated circuit embodiment. The integrated circuit 450 includes a memory array 400 implemented using nonvolatile memory cells, on a semiconductor substrate. The memory cells of array 400 are interconnected in a virtual ground array. A row decoder 401 is coupled to a plurality of word lines 402 arranged along rows in the memory array 400. A column decoder 403 is coupled to a plurality of bit lines 404 arranged along columns in the memory array 400. Addresses are supplied on bus 405 to column decoder 403 and row decoder 401. Sense amplifiers and data-in structures in block 406 are coupled to the column decoder 403 via data bus 407. Data is supplied via the data-in line 411 from input/output ports on the integrated circuit 450, or from other data sources internal or external to the integrated circuit 450, to the data-in structures in block 406. Data is supplied via the data-out line 415 from the sense amplifiers in block 406 to input/output ports on the integrated circuit 450, or to other data destinations internal or external to the integrated circuit 450. A bias arrangement state machine 409 controls the application of bias arrangement supply voltages 408, such as for the erase verify and program verify voltages, and the arrangements for programming, erasing, and reading the memory cells, such as with the read command that results in precharging and measuring bit line currents as described herein.

Figure 5A:
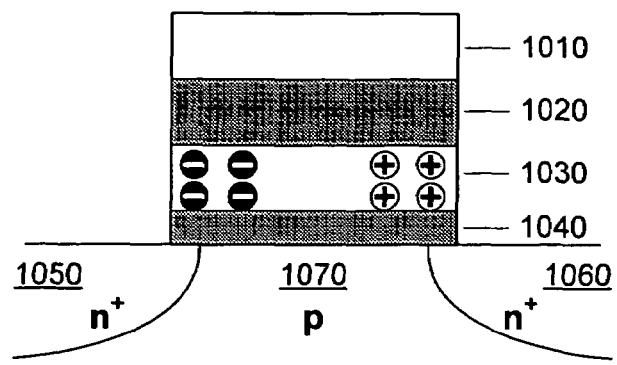
FIG. 5 shows examples of nonvolatile memory cells with varying charge storage materials.
Figure 5B:
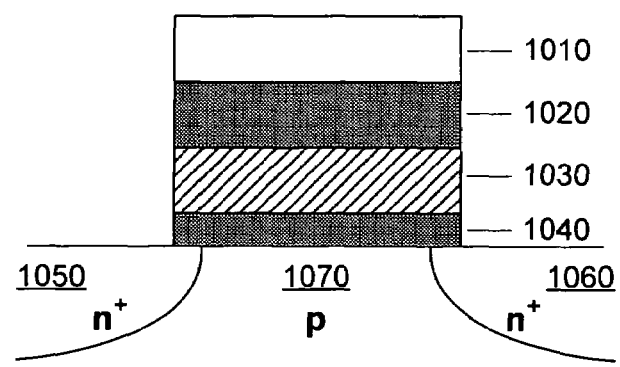
Figure 5C:
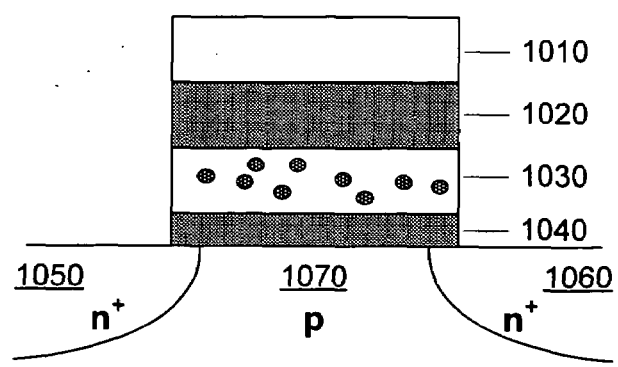

FIGS. 5A, 5B, and 5C show examples of nonvolatile memory cells with varying charge storage materials. FIG. 5A is a simplified diagram of a charge trapping memory cell The p-doped substrate region 1070 includes n+ doped source and drain regions 1050 and 1060. The remainder of the memory cell includes a bottom dielectric structure 1040 on the substrate, a charge trapping structure 1030 on the bottom dielectric structure 1040 (bottom oxide), a top dielectric structure 1020 (top oxide) on the charge trapping structure 1030, and a gate 1010 on the oxide structure 1020. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge storage material 1030 schematically shows electrons by the source region 1050 and holes by the drain region 1060 to indicate that particular regions of the charge trapping material are storing relatively more negative or positive charge than another region of the charge trapping material.

The memory cell for SONOS-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers. Other charge trapping memory cells are PHINES and NROM.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni—T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

FIG. 5B shows a nonvolatile memory cell resembling the nonvolatile memory cell of FIG. 5A, but with a floating gate 1030, often made of polysilicon. FIG. 5C shows a nonvolatile memory cell resembling the nonvolatile memory cell of FIG. 5A, but with a nanoparticle charge storage structure 1030.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory circuit, comprising:
   a virtual ground array of nonvolatile memory cells arranged in a plurality of rows and a plurality of columns, each of the nonvolatile memory cells including: a gate, a first current carrying terminal, and a second current carrying terminal;
   switching circuitry coupling the current carrying terminals of the nonvolatile memory cells to reference and precharge voltages and sense amplifiers; and
   logic controlling the switching circuitry and the virtual ground array, the logic responding to a read command, by causing at least: coupling one of the current carrying terminals of first and second nonvolatile memory cells of the virtual ground array to the reference voltage, reducing leakage currents associated with the read command by coupling another of the current carrying terminals of the first and second nonvolatile memory cells to the precharge voltage, and measuring currents flowing through the first and second nonvolatile memory cells via sense amplifiers coupled to said another of the current carrying terminals of the first and second nonvolatile memory cells.

2. The circuit of claim 1, wherein the first and second nonvolatile memory cells of the virtual ground array are in a same row of the plurality of rows.

3. The circuit of claim 1, wherein the first and second nonvolatile memory cells of the virtual ground array are in a same row of the plurality of rows and separated by at least two columns of the plurality of columns.

4. The circuit of claim 1, wherein the first and second nonvolatile memory cells of the virtual ground array are in a same row of the plurality of rows, and wherein during said currents include a first current flowing through the first nonvolatile memory cell and a second current flowing through the second nonvolatile memory cell flow in opposite directions through the same row.

5. The circuit of claim 1, wherein the first and second nonvolatile memory cells of the virtual ground array are in different columns of the plurality of columns.

6. The circuit of claim 1, wherein said one of the current carrying terminals of the first and second nonvolatile memory cells of the virtual ground array is a drain terminal of the first and second nonvolatile memory cells, and said another of the current carrying terminals of the first and second nonvolatile memory cells is a source terminal of the first and second nonvolatile memory cells.

7. The circuit of claim 1, further comprising
a plurality of bit lines coupled to the switching circuitry and the virtual ground array,
wherein, in response to said read command, only bit lines of the plurality of bit lines connected to said another of the current carrying terminals of the first and second nonvolatile memory cells are coupled to the precharge voltage.

8. The circuit of claim 1, wherein the reference voltage is ground.

9. The circuit of claim 1, further comprising:
the plurality of sense amplifiers coupled to the switching circuitry.

10. The circuit of claim 1, wherein the nonvolatile memory cells store data on charge trapping material.

11. The circuit of claim 1, wherein the nonvolatile memory cells store data on floating gate material.

12. The circuit of claim 1, wherein the nonvolatile memory cells store data on nanocrystal material.

13. A method of operating a virtual ground array of nonvolatile memory cells arranged in a plurality of rows and a plurality of columns, each of the nonvolatile memory cells including: a gate, a first current carrying terminal, and a second current carrying terminal, comprising:
in response to a read command:
coupling one of the current carrying terminals of first and second nonvolatile memory cells of the virtual ground array to a reference voltage,
reducing leakage currents associated with the read command by coupling another of the current carrying terminals of the first and second nonvolatile memory cells to a precharge voltage; and
measuring currents flowing through the first and second nonvolatile memory cells via sense amplifiers coupled to said another of the current carrying terminals of the first and second nonvolatile memory cells.

14. The method of claim 13, wherein the first and second nonvolatile memory cells of the virtual ground array are in a same row of the plurality of rows.

15. The method of claim 13, wherein the first and second nonvolatile memory cells of the virtual ground array are in a same row of the plurality of rows and separated by at least two columns of the plurality of columns.

16. The method of claim 13, wherein the first and second nonvolatile memory cells of the virtual ground array are in a same row of the plurality of rows, and wherein said currents include a first current flowing through the first nonvolatile memory cell and a second current flowing through the second nonvolatile memory cell flow in opposite directions through the same row.

17. The method of claim 13, wherein the first and second nonvolatile memory cells of the virtual ground array are in different columns of the plurality of columns.

18. The method of claim 13, wherein said one of the current carrying terminals of the first and second nonvolatile memory cells of the virtual ground array is a drain terminal of the first and second nonvolatile memory cells, and said another of the current carrying terminals of the first and second nonvolatile memory cells is a source terminal of the first and second nonvolatile memory cells.

19. The method of claim 13, further comprising
a plurality of bit lines coupled to the switching circuitry and the virtual ground array,
wherein, in response to said read command, only bit lines of the plurality of bit lines connected to said another of the current carrying terminals of the first and second nonvolatile memory cells are coupled to the precharge voltage.

20. The method of claim 13, wherein the reference voltage is ground.

21. The method of claim 13, wherein the nonvolatile memory cells store data on charge trapping material.

22. The method of claim 13, wherein the nonvolatile memory cells store data on floating gate material.

23. The method of claim 13, wherein the nonvolatile memory cells store data on nanocrystal material.

24. A method of manufacturing nonvolatile memory circuit, comprising:
providing a virtual ground array of nonvolatile memory cells arranged in a plurality of rows and a plurality of columns, each of the nonvolatile memory cells including: a gate, a first current carrying terminal, and a second current carrying terminal;
providing switching circuitry coupling the current carrying terminals of the nonvolatile memory cells to reference and precharge voltages and sense amplifiers; and
providing logic controlling the switching circuitry and the virtual ground array, the logic responding to a read command, by causing at least: coupling one of the current carrying terminals of first and second nonvolatile memory cells of the virtual ground array to the reference voltage, reducing leakage currents associated with the read command by coupling another of the current carrying terminals of the first and second nonvolatile memory cells to the precharge voltage, and measuring currents flowing through the first and second nonvolatile memory cells via sense amplifiers coupled to said another of the current carrying terminals of the first and second nonvolatile memory cells.

* * * * *